United States Patent [19]

Matsuzaki et al.

[11] 3,984,301

[45] Oct. 5, 1976

[54] SPUTTER-ETCHING METHOD EMPLOYING FLUOROHALOGENOHYDROCARBON ETCHING GAS AND A PLANAR ELECTRODE FOR A GLOW DISCHARGE

[75] Inventors: Reisaku Matsuzaki; Naokichi Hosokawa, both of Tokyo, Japan

[73] Assignee: Nippon Electric Varian, Ltd., Tokyo, Japan

[22] Filed: Aug. 8, 1974

[21] Appl. No.: 495,678

[30] Foreign Application Priority Data

Aug. 11, 1973 Japan .............................. 48-89647
Feb. 7, 1974 Japan .............................. 49-14888

[52] U.S. Cl. .............................................. 204/192
[51] Int. Cl.[2] ........................................ C23C 15/00
[58] Field of Search ................ 204/192, 298; 156/7, 156/8, 17

[56] References Cited

UNITED STATES PATENTS

| | | | |
|---|---|---|---|
| 3,271,286 | 9/1966 | Lepselter | 204/192 |
| 3,474,021 | 10/1969 | Davidse et al. | 204/192 |
| 3,477,936 | 11/1969 | Gillery et al. | 204/192 |
| 3,598,710 | 8/1971 | Davidse | 204/192 |
| 3,640,812 | 2/1972 | Vossen, Jr. et al. | 204/192 |
| 3,676,317 | 7/1972 | Harkins, Jr. | 204/192 |
| 3,730,873 | 5/1973 | Pompei et al. | 204/298 |
| 3,795,557 | 3/1974 | Jacob | 156/8 |
| 3,849,276 | 11/1974 | Greiner | 204/192 |
| 3,867,216 | 2/1975 | Jacob | 156/2 |
| 3,880,684 | 4/1975 | Abe | 156/8 |

OTHER PUBLICATIONS

L. Maissel et al., "Handbook of Thin Film Technology," McGraw-Hill Book Co., New York, 1970, pp. 4–32.

*Primary Examiner*—John H. Mack
*Assistant Examiner*—Aaron Weisstuch
*Attorney, Agent, or Firm*—Ostrolenk, Faber, Gerb & Soffen

[57] ABSTRACT

On sputter-etching a substrate, fluorochloro- or fluorobromohydrocarbon gas is used as an etching gas in a chamber evacuated to a pressure of at least as low as $10^{-5}$ Torr. The etching gas is introduced at a pressure between $5 \times 10^{-3}$ and $5 \times 10^{-2}$ Torr. Use is also made of a planar electrode for supporting the substrate and responsive to an r.f. power supplied thereto for producing a glow discharge.

9 Claims, 10 Drawing Figures

SPUTTER-ETCHING METHOD EMPLOYING FLUOROHALOGENOHYDROCARBON ETCHING GAS AND A PLANAR ELECTRODE FOR A GLOW DISCHARGE

BACKGROUND OF THE INVENTION

This invention relates to a method and apparatus for sputter-etching a substrate. This invention is specifically suitable to etching a substrate of silicon or its compound during manufacture of an integrated circuit.

For purely chemically etching a substrate of silicon or its compound, use has been made of a mixture of fluoric and nitric acids, fluoric, nitric, and acetic acids, or the like. The etchant presents a problem of pollution. In addition, chemical etching complicates the process of manufacture of integrated circuits because the silicon wafers must repeatedly be placed into a vacuum for vacuum evaporation or sputtering and then removed therefrom for the chemical etching.

Use has also been made of conventional radio-frequency sputtering apparatus, which removes the problems of pollution and complicated processes. The speed of etching, however, is low. In addition, the sputtering apparatus is not suited to etching substrates with high reproducibility and with uniform depth of etch at various portions of a substrate because the r.f. sputtering apparatus has been developed specifically for deposition of a thin film on a substrate by sputtering and not for sputter-etching.

Recently, apparatus called a plasma asher has been put on the market. With the plasma asher, a radio-frequency coil produces plasmas by radio-frequency induction, which plasmas etch the substrate. Applicants have tried such apparatus to sputter-etch silicon wafers by producing plasmas in tetrafluoromethane introduced into the exhaustible space of the apparatus. It has been found that the wafer surface becomes rough and that the speed of etching is not uniform across the surface. For example, the etching was about twice as deep at the center of a silicon wafer, 5 cm in diameter, as at the periphery. In addition, the speed of etching irregularly depends on the distance between the wafers which should be placed in the space so as to be perpendicular to the coil axis.

SUMMARY OF THE INVENTION

It is therefore a general object of the present invention to provide a method and apparatus for sputter-etching a substrate without the problems of pollution.

It is another object of this invention to provide a method and apparatus for sputter-etching a substrate at a high speed.

It is still another object of this invention to provide a method and apparatus for sputter-etching a substrate with high reproducibility.

It is yet another object of this invention to provide a method and apparatus for uniformly sputter-etching a substrate.

It is a further object of this invention to provide a method and apparatus for sputter-etching a substrate without rendering its surface rough.

It is a subordinate object of this invention to provide a method and apparatus for sputter-etching a substrate of silicon or a silicon compound for use in manufacturing integrated circuits, enabling the manufacture thereof to be carried out without exposing the substrate to atmospheric pressure.

In accordance with this invention there is provided a method of sputter-etching a substrate, comprising the steps of placing the substrate on planar electrode means disposed in an exhaustible space, evacuating the space to a first predetermined pressure, introducing an etching gas comprising fluorohalogenohydrocarbon gas into the evacuated space at a second predetermined pressure, and supplying radio-frequency electric power to the electrode means to produce a glow discharge in the etching-gas filled space, thereby sputter-etching the substrate.

In accordance with this invention there is also provided apparatus for sputter-etching a substrate, comprising planar electrode means in an exhaustible space, first means for introducing an etching gas comprising fluorohalogenohydrocarbon gas into the space, and second means for supplying radio-frequency electric power to the electrode means to produce a glow discharge in the space evacuated and filled with the etching gas. The apparatus may preferably comprise dielectric plate means for removably covering the substrate and control means for moving the dielectric plate means relative to the planar electrode means.

It is believed that the mechanism of sputter-etching according to this invention is as follows. Application of radio-frequency power to the electrode means produces a glow discharge as is the case with conventional radio-frequency sputtering. Positive ions of the fluorohalogenohydrocarbon gas produced by the discharge are accelerated to the electrode means during negative half cycles of the radio-frequency power to bombard the substrate and to sputter-etch the same. In addition, radicals are freed by the discharge from the fluorohalogenohydrocarbon gas molecules to come into contact with the substrate. In cases where the substrate is made of silicon or its compound, a chemical reaction takes place between the radicals and the substrate. This is probable because those portions of the substrate are etched to an appreciable extent which are not subjected to strong bombardment by the positive ions. This applies unless the material of the substrate is inactive with the radicals. It has been confirmed that the speed of etching is as high as about 2000 A per minute and is somewhat raised by the use of an etching gas including oxygen.

Figure 1:
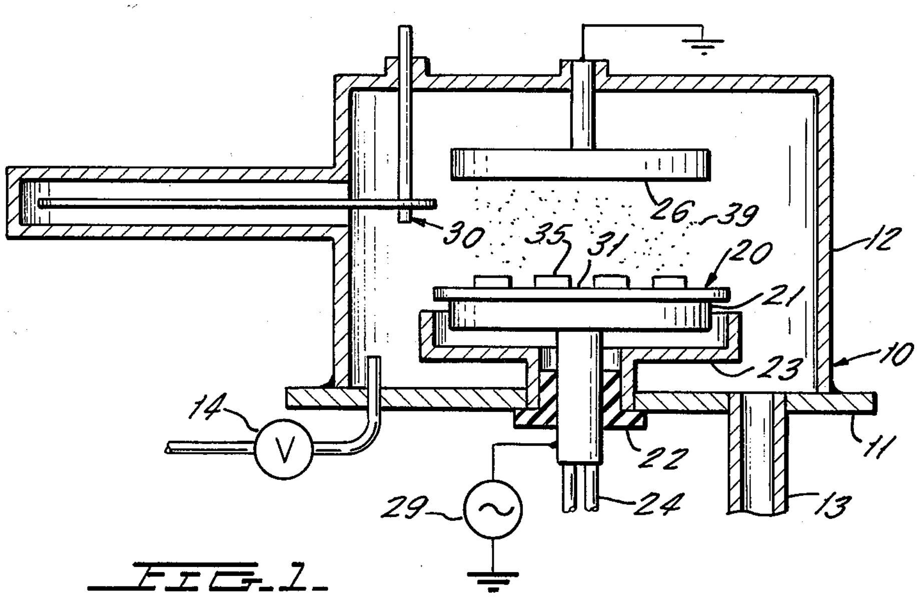
FIG. 1 is a schematic sectional view of conventional radiofrequency sputtering apparatus which may be used to carry out sputteretching.

DESCRIPTION OF THE PREFERRED EMBODIMENTS:

Referring to FIG. 1, conventional radio-frequency sputtering apparatus includes a vacuum envelope 10 comprising, in turn, a base plate 11 and a metal bell jar 12 hermetically sealed to the base plate 11. The vacuum envelope 10 is accompanied by an exhaust pipe 13 for evacuating the space enclosed therewith and a pipe having an interposed variable leak valve 14 for introducing a sputtering gas into the space. The apparatus further includes radio-frequency electrode means 20 comprising, in turn, a planar radio-frequency electrode 21 having a stay, an insulating spacer 22 interposed between the electrode stay and the base plate 11 to hold the electrode 21 substantially parallel to the base plate 11, and a shield 23 for shielding the electrode 21 as shown. In most cases, the electrode means 20 is provided with a water duct 24 for cooling the electrode 21. In the example being illustrated, the electrode means 20 further comprises a grounded opposing electrode 26 attached to the bell jar 12 in electric contact therewith. A radio-frequency power source 29 is connected between the electrode stay and ground. The apparatus still further comprises a shutter 30.

For sputtering, one or more substrates (not shown) are attached to the opposing electrode 26. For the purpose of sputter-etching, an etching table 31 for putting one or more substrates 35 thereon is placed on the planar electrode 21. After the space is evacuated and then filled with the sputtering gas, the radio-frequency power is supplied to the electrode 21 to produce plasmas 39 between the planar and opposing electrodes 21 and 26. The shutter 30 is left idle.

Figure 2:
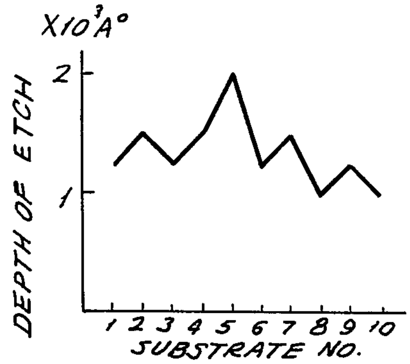
FIG. 2 shows the depths of etch carried out with the use of the apparatus depicted in FIG. 1 for individual substrates of a test lot.

Referring to FIG. 2, a plurality of aluminium substrates were successively subjected to sputter-etching to show the reproducibility attained with the conventional apparatus illustrated with reference to FIG. 1. Use was made of a quartz etching table 31, argon gas at $2 \times 10^{-2}$ Torr as the sputtering gas, radio-frequency power of 0.5 W/cm$^2$ on the etching table 31, and a sputtering time of 10 minutes. It is believed that the poor reproducibility results from fluctuations in the power at which the discharge occurs. The reproducibility will therefore be raised if the substrate or substrates 35 could be placed on the etching table 31 after the discharge became stable. This is, however, quite difficult.

Figure 3:
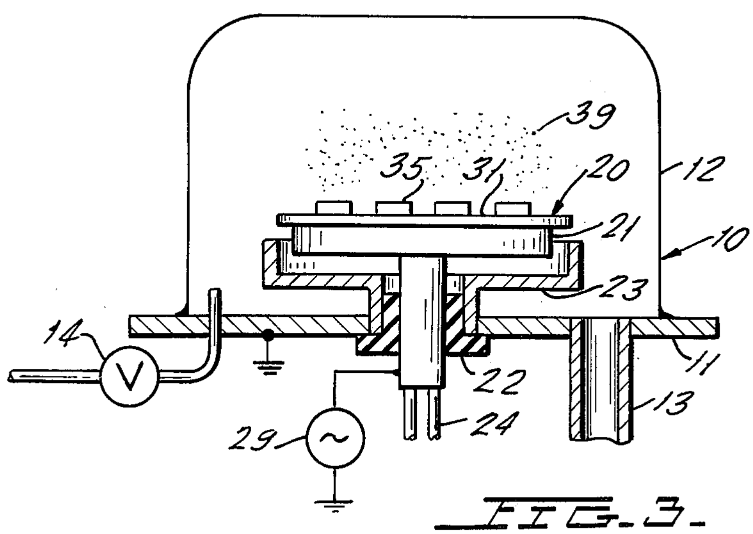
FIG. 3 is a schematic sectional view of radio-frequency sputter-etching apparatus that may be used to carry out the method according to the instant invention.

Referring to FIG. 3, sputter-etching apparatus for use in carrying out the method of the present invention comprises parts corresponding to those illustrated with reference to FIG. 1 and designated with like reference numerals, except for the opposing electrode 26 and the shutter 30. Even with this apparatus, the reproducibility is poor if the method of this invention is not resorted to. Furthermore, the substrate 35 is often etched deeper at the center of the etching table 31 than at the periphery thereof.

With the use of the apparatus depicted in FIG. 3, sputteretching is carried out in accordance with the method of this invention by evacuating the space enclosed with the vacuum envelope 10 to $10^{-5}$ to $10^{-7}$ Torr, introducing an etching gas comprising fluorohalogenohydrocarbon gas into the evacuated space at $5 \times 10^{-3}$ to $5 \times 10^{-2}$ Torr, and supplying a radio-frequency power of several hundred watts to the radio-frequency electrode means 20 to produce a glow discharge in the gas-filled space. The glow discharge produces, in turn, the plasmas 39 above the planar electrode 21. Hydrocarbon may be an alkane or an alkene. Halogen may be chlorine or bromine.

With the use of a planar electrode 21 of a diameter of 170 mm, the radio-frequency power between 300 and 650 W, and the etching gas pressure of $2 \times 10^{-2}$ Torr, the speed of etch was 1700 to 2600 A/minute. The speed is about 10 times as high as that of about 200 A/minute attained with the sputter-etch carried out in the conventional argon sputtering gas under like conditions. In this connection, it may be mentioned here that the speed of etch is substantially linearly proportional to the radio-frequency power in argon. Ten times as high a radio-frequency power would therefore result in a similar high etching speed. This large power, however, results in undue bombardment of the substrate 35 to undesirably damage the same and raise the temperature thereof to several hundred degrees centigrade. When the substrate 35 is a wafer for integrated circuits, a rise in the temperature to about 250°C adversely affects the photoresist film coated on the substrate 35 as an etching mask. With the method of this invention, the temperature rises only to about 100°C. The etching speed is not proportional to the radio-frequency power. More particularly, with the powers of 300 W and 150 W, the speed decreases only 10% and 15%, respectively, as compared with the speed at the power of 600 W. The speed can be further raised with oxygen contained in the etching gas. For example, the speed rises by 10% and 20% when the oxygen contents are 50% and 80%, respectively.

It will readily be understood that this invention obviates the possibility of pollution and makes it possible to carry out sputtering of a thin film on the wafer and subsequent etching of the wafer in a single vacuum envelope 10 without subjecting the wafer to atmospheric pressure. As examined with the naked eye, the sputter-etched surface is as smooth as the surface that is not subjected to the sputter-etch. Even with a microscope, it is impossible to observe the damages which are found on the surface sputter-etched in argon. Besides excellent reproducibility, the fluctuation in the depth of etch is only within ± 10% on the planar electrode 21 of the 170-mm diameter. Incidentally, it is possible to substantially completely remove a platinum silicide film as desired which is formed to provide an ohmic contact to a wafer of silicon or its compound and which could not be removed with the acid mixtures. The etching gas may be a mixture of fluorohalogenohydrocarbon gas of several kinds and contain at least one member selected from the group consisting of oxygen, argon, nitrogen, and air.

Examples of etching speeds attained for silicon substrates with various etching gases of $2.0 \times 10^{-2}$ Torr and with the radio-frequency power density of 1.3 W/cm$^2$ on the etching table 31 are as follows:

| | | |
|---|---|---|
| | argon | 124 A/minute |
| | $C_2HCl_3$ | 330 |
| | $CHCl_2F$ | 410 |
| | $CF_4$ | 900 |
| | $(CCl_2F)_2$ | 1280 |
| | $CHClF_2$ | 1430 |
| | $CCl_3F$ | 1670 |
| | $(CBr_2F)_2$ | 1850 |
| | $CCl_2FCClF_2$ | 2015 |
| and | $CCl_2F_2$ | 2200. |

Examples of etching speeds attained for various sbustrates with the etching gas pressure of $2.0 \times 10^{-2}$ Torr and with a radio-frequency power density of 1.3 W/cm$^2$ on the etching table 31 are as follows:

| | argon | $CCl_2FCClF_2$ | $CCl_2F_2$ |
|---|---|---|---|
| silicon | 124 | 2015 | 2200 |
| quartz | 159 | 470 | 533 |
| Corning No. 7059 glass | 103 | 144 | 347 |
| aluminium | 166 | 637 | 1624 |
| molybdenum | 185 | 775 | 836 |
| stainless steel | 154 | 222 | 522 |
| photoresist | 185 | 608 | 410. |

Figure 4A:
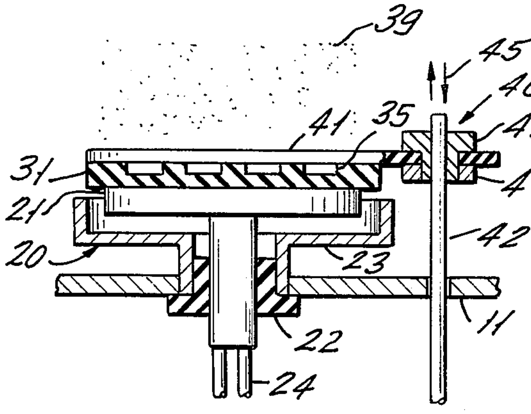
FIGS. 4A and 4B schematically show a principal portion of sputter-etching apparatus according to a preferred aspect of this invention in different modes of operation.
Figure 4B:
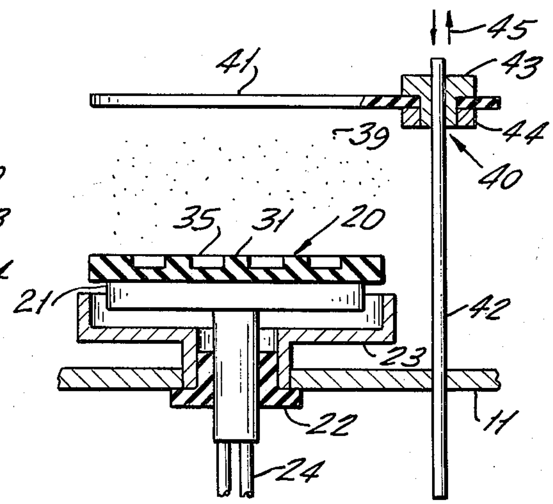

Referring to FIGS. 4A and 4B, sputter-etching apparatus according to a preferred aspect of this invention comprises parts similar to those illustrated with reference to FIG. 1 and designated with like reference numerals. The apparatus further comprises dielectric plate means 40 comprising, in turn, a dielectric plate 41 and a support 42 to which the dielectric plate 41 is fixed by means of members 43 and 44. The support 42 is axially slidable as symbolized by a pair of arrows 45 through the base plate 11 to selectively place the dielectric plate 41 in a first position of protecting the substrate 35 against the plasma 39 and in a second position of exposing the substrate 35 to the plasmas 39. The dielectric plate 41 is preferably made of quartz, hard glass, alumina, or the like. Other parts of the dielectric plate means 40 may be made of metal or any other material provided that these parts have sufficient mechanical strength and are suitable for use in a high vacuum. Preferably, the etching table 31 is provided with a plurality of indentations or recesses for snugly receiving the substrate or substrates 35.

In operation, the dielectric plate 41 is moved at first to a position as close as possible to the substrate 35 put on the etching table 31 as shown in FIG. 4A to render the effective distance between the etching table 31 and the dielectric plate 41 zero. When the radio-frequency power is supplied to the planar electrode 21, the discharge occurs in the space above the dielectric plate 41. Ions produced in the plasmas 39 bombard the outside surface of the dielectric plate 41 but not the substrate 35. After the discharge becomes stable, the dielectric plate 41 is displaced from the substrate 35 as shown in FIG. 4B to make the discharge spread mainly between the etching table 31 and the dielectric plate 41 and to cause the ions to now bombard the substrate 35. The "dielectric" plate 41 is made of a dielectric material because the discharge would otherwise temporarily disappear during the time that the "dielectric" plate 41 is moved from the first position to the second position. The distance between the etching table 31 and the dielectric plate 41 when in the second position appreciably affects the speed and the depth uniformity. The optimum distance depends on the configuration of the radio-frequency electrode means 20, the material of the substrate 35, the kind and pressure of the etching gas, and the radio-frequency power. With a planar electrode 21 of a diameter of 280 mm, an etching table 31 made of quartz, a silicon substrate 35, an etching gas of argon at $2.0 \times 10^{-2}$ Torr, and a power density of 1.3 W/cm$^2$, the optimum distance of 75 mm provides an etching speed of 120 A/minute and the depth deviation of within ± 8%.

Figure 5:
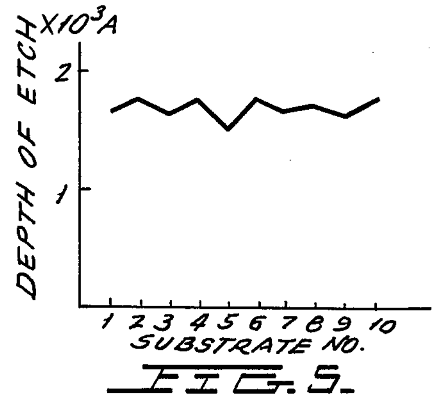
FIG. 5 shows the depths of etch achieved with the use of the apparatus depicted in FIGS. 4A and 4B for individual substrates of a lot.

Referring to FIG. 5, aluminium substrates 35 were successively sputter-etched with the apparatus according to the preferred aspect of this invention under the same conditions as those applied to the test lot depicted in FIG. 2. It will readily be understood that the reproducibility is raised with the present invention.

Referring finally to FIGS. 6A through 6D, sputter-etching apparatus according to another preferred aspect of this invention comprises similar parts designated with like reference numerals as in FIGS. 1, 4A, and 4B. The planar electrode 21 and the etching table 31 of the radio-frequency electrode means 20 are not depicted in these figures for simplicity of illustration. Here, the first dielectric plate 41, namely, the dielectric plate of the dielectric plate means 40 is rotatable as symbolized by an arrow 40' around an offset axis provided by the support 42. The apparatus further comprises a target electrode 20' for supplying the material of a thin film to be formed on the substrate (not shown) put on the etching table, an accompanying shutter 30 having a second dielectric plate 46 for removably covering the target electrode 20', and an additional radio-frequency source 29' for sputtering the material of the target electrode 20' onto the substrate. The target electrode 20' is positioned to oppose the planar electrode 21 and to define a region where the plasmas 39 are produced. The second dielectric plate 46, placed in a position of covering the target electrode 20', functions in the same manner as the dielectric plate of the dielectric plate means 40 placed in the second position illustrated with reference to FIG. 4B. First and second switches 49 and 49' are illustrated for the sputter-etching and sputtering radio-frequency power sources 29 and 29'.

Figure 6A:
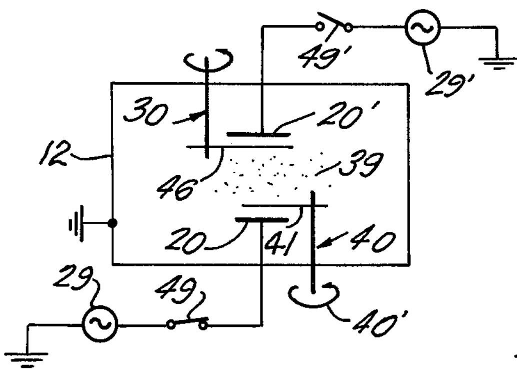
FIGS. 6A, 6B, 6C, and 6D schematically show a principal portion of a sputter-etching apparatus according to another preferred aspect of this invention in different modes of operation.
Figure 6B:
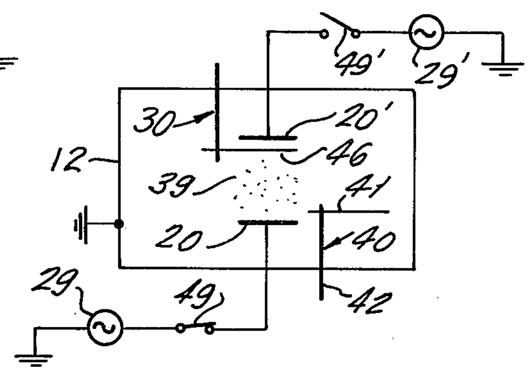
Figure 6C:
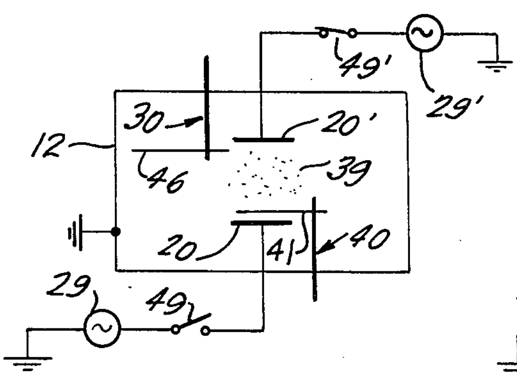
Figure 6D:
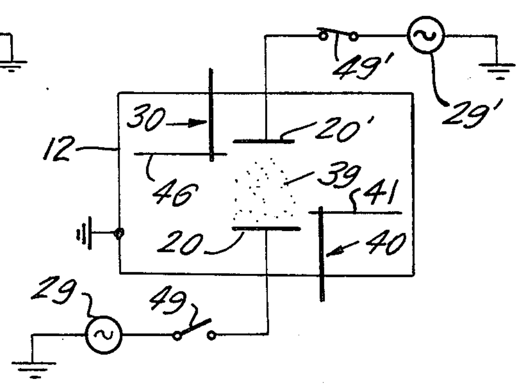

In operation, both dielectric plates 41 and 46 are placed at first in covering positions for covering the etching table 20 and the target electrode 20', respectively, after the substrate is put on the etching table as shown in FIG. 6A. The first switch 49 is closed to produce the plasmas 39 between the dielectric plates 41 and 46. After the glow discharge reaches the stable state, a first dielectric plate 41 is placed in an offset position depicted in FIG. 6B. The substrate is now sputter-etched. Subsequently, the first and second dielectric plates 41 and 46 are put in the covering and offset positions, respectively, as shown in FIG. 6C. The first and second switches 49 and 49' are put in the open and closed states, respectively. The target electrode 20' is subjected to pre-sputtering. The first dielectric plate 41 is now placed in the offset position depicted in FIG. 6D to allow the desired film to be formed on the sputter-etched substrate surface.

While this invention has thus far been described specifically in conjunction with several preferred embodiments and aspects, it will readily be understood that the invention is not restricted to those embodiments and aspects. For example, the planar electrode 21 and the etching table 31 need not be horizontally disposed. Again, the radio-frequency electrode means 20 may be moved instead of the dielectric plate means 40.

What is claimed is:

1. A method of sputter-etching a substrate, comprising the steps of placing said substrate on planar electrode means disposed in an exhaustible space, evacuating said exhaustible space to a first predetermined pressure lower than about $10^{-5}$ Torr, introducing an etching gas comprising fluorohalogenohydrocarbon gas into the now evacuated space at a second predetermined pressure between about $5 \times 10^{-3}$ and $5 \times 10^{-2}$ Torr, and supplying radio-frequency electric power to said planar electrode means to produce a glow discharge in the etching-gas filled space, thereby sputter-etching said substrate.

2. A method as claimed in claim 1, wherein said fluorohalogenohydrocarbon gas is fluorochlorohydrocarbon gas.

3. A method as claimed in claim 2, wherein said fluorochlorohydrocarbon gas is at least one member selected from the group consisting of difluorodichloromethane, 1-fluorodichloro-2-difluorochloroethane, fluorotrichloromethane, difluorochloromethane, and 1,2-fluorodichloroethane.

4. A method as claimed in claim 1, wherein said fluorohalogenohydrocarbon gas is fluorobromohydrocarbon gas.

5. A method as claimed in claim 4, wherein said fluorobromohydrocarbon gas is 1,2-fluorodibromoethane.

6. A method as claimed in claim 1, wherein said etching gas further comprises at least one member selected from the group consisting of oxygen, argon, nitrogen, and air.

7. A method as claimed in claim 1, wherein said first pressure is between $10^{-5}$ and $10^{-7}$ Torr.

8. A method as claimed in claim 1, wherein said electrode means comprises a planar electrode and an etching table placed on said planar electrode.

9. A method as claimed in claim 8, further comprising the steps of placing dielectric plate means on said substrate disposed on said etching table before supplying said electric power to said electrode means to protect said substrate against said discharge, and placing said dielectric plate means at a predetermined distance from said substrate after said discharge reached a stable state.

* * * * *